(12) United States Patent
Joshi

(10) Patent No.: US 6,640,330 B1
(45) Date of Patent: Oct. 28, 2003

(54) SYSTEM AND METHOD FOR SETUP AND HOLD CHARACTERIZATION IN INTEGRATED CIRCUIT CELLS

(75) Inventor: Hemant Joshi, Milpitas, CA (US)

(73) Assignee: Artisan Components, Inc., Sunnyvale, CA (US)

( * ) Notice: Subject to any disclaimer, the term of this patent is extended or adjusted under 35 U.S.C. 154(b) by 286 days.

(21) Appl. No.: 09/841,797

(22) Filed: Apr. 24, 2001

(51) Int. Cl.[7] .............................................. G06E 17/50
(52) U.S. Cl. ................................................ 716/9; 716/6
(58) Field of Search .............................. 716/1, 2, 3, 6, 716/9, 10, 11, 16, 18

(56) References Cited

U.S. PATENT DOCUMENTS

| | | | | |
|---|---|---|---|---|
| 5,663,889 A | * | 9/1997 | Wakita | 716/6 |
| 5,819,072 A | * | 10/1998 | Bushard et al. | 716/10 |
| 5,956,256 A | * | 9/1999 | Rezek et al. | 716/3 |
| 5,956,257 A | * | 9/1999 | Ginetti et al. | 716/3 |
| 6,216,256 B1 | * | 4/2001 | Inoue et al. | 716/6 |
| 6,314,553 B1 | * | 11/2001 | Stevens et al. | 716/18 |
| 6,484,297 B1 | * | 11/2002 | Dixit et al. | 716/6 |
| 6,543,032 B1 | * | 4/2003 | Zolotykh et al. | 716/2 |

* cited by examiner

*Primary Examiner*—Steven Loke
*Assistant Examiner*—Douglas W. Owens
(74) *Attorney, Agent, or Firm*—Martine & Penilla, LLP

(57) ABSTRACT

An invention is disclosed for setup and hold time characterization in an integrated circuit cell. A setup time is obtained for a first constraint pin. A setup time is also calculated for a test point defined in the integrated circuit cell using the setup time for the first constraint pin and a first propagation delay from the first constraint pin to the test point. A setup time for a second constraint pin is determined based on the setup time for the test point and a second propagation delay from the second constraint pin to the test point. In addition to the setup time, a hold time can be obtained for the first constraint pin, and a hold time for the test point can be calculated using the hold time for the first constraint pin and the first propagation delay. Further, a hold time for the second constraint pin can be determined based on the hold time for the test point and the second propagation delay.

15 Claims, 8 Drawing Sheets

SYSTEM AND METHOD FOR SETUP AND HOLD CHARACTERIZATION IN INTEGRATED CIRCUIT CELLS

BACKGROUND OF THE INVENTION

1. Field of the Invention

The present invention relates generally to integrated circuits, and more particularly, to systems and methods for enhancing setup and hold characterization in an integrated circuit.

2. Description of the Related Art

Generally, semiconductor integrated circuits are designed and fabricated by first preparing a schematic diagram or hardware description language (HDL) specification of a logical circuit in which functional elements are interconnected to form a particular logical function. With standard cell technology, the schematic diagram or HDL specification is synthesized into standard cells of a specific cell library.

FIG. 1 is a schematic diagram of a section of an exemplary prior art integrated circuit 100. The integrated circuit section 100 includes a plurality of rows 102 separated into standard cells 104. Each standard cell 104 corresponds to a logical function unit, which is implemented by one or more transistors that are optimized for the cell. These functional units can be combinational cells, such as adders and gates, or sequential cells, such as flip-flops and latches.

Each of the sequential cells has "setup" and "hold" timing constraints, which are recorded in the timing library. During the design process, a series of computer-aided design tools generate a netlist of the selected cells 104 and the interconnections between the cells 104. A floor planner or placement tool uses the netlist to place the selected cells 104 at particular locations in an integrated circuit layout pattern. The interconnections between the cells 104 are then routed along predetermined routing layers. Once the selected cells 104 have been placed and routed, the netlist, the cell layout definitions, the placement data and the routing data together form an integrated circuit layout definition, which is used to fabricate the integrated circuit.

As mentioned above, each of the sequential cells has "setup" and "hold" timing constraints, which are recorded in the timing library. These constraints guide the chip design tool to meet timing goals set during the chip design phase. FIG. 2 is a schematic diagram showing a prior art flip-flop 200. The flip-flop 200 includes a data pin 202, an output pin 204, and a clock 206. To ensure the flip-flop 200 is functional, a time constraint exists between the constraint pin, which is the data pin 202, and the reference pin, which is the clock 206. For the flip-flop 200, the data should arrive on the data pin 202 a particular amount of time before the clock 206 is asserted. This time period is referred to as the setup time. Also to ensure the flip-flop 200 is functional, another time constraint exists between the constraint pin 202 and the reference pin 206. In this case, the data needs to stay on the data pin 202 while the clock 206 is asserted for particular amount of time. This time period is referred to as the hold time.

FIG. 3 is a timing diagram illustrating setup and hold times for the flip-flop 200. Graph 202a illustrates the graph of the data pin 202 and graph 206a illustrates a graph of the clock 206. Point 302 is the time when the data is considered to be stable on the data pin 202. Point 306 is the time when the clock 206 is considered asserted, and point 304 is the time when the data pin 202 is considered changed.

The time period between point 302 and point 306 is the setup time, which is the minimum amount of the time that the data should be on the data pin 202 before the clock 206 is asserted on the flip-flop 200. The time period between point 306 and point 304 is the hold time, which is the minimum amount of time that the data should be on the data pin 202 while the clock 206 is asserted on the flip-flop 200.

Two prior art methods are currently used to determine the setup time and the hold time for standard cells, 1) a test point method and 2) a binary search method. The test point method defines a plurality of test points throughout the cell logic. Next, propagation delays are determined from the input pins to the test points defined in the circuit. The propagation delays are then used to calculate the setup time and hold time constraints for the circuit. Unfortunately, the test point method is not accurate, and therefore, designers are forced to use pessimistic results for the setup and hold time values to ensure operability of the circuit.

The binary search method is an optimization process that runs multiple SPICE simulations with predefined objective (generally propagation delay) to determine setup and hold timing constraints. Since executing multiple SPICE simulations is a slow time consuming process, each of these optimization runs takes long time to complete. The binary search method is further slowed for cells that have more than one "constraint" pin as the optimization runs needs to be executed for each constraint pin and for all the sensitizing states on other constraint pins.

In total, four optimization runs would need to be executed to determine the setup rising time, setup falling time, hold rising time, and hold falling time for the constraint pin 202 and reference pin 206 of the flip-flop 200 of FIG. 2 using the binary search method. Each sequential cell generally includes a primitive sequential element, such as a flip-flop or latch, and combinational logic that connects the constraint ports of the sequential cell to the constraint port of the primitive sequential element. Further, the reference port of the sequential cell generally is connected to the reference port of the primitive sequential element.

FIG. 4 is a schematic diagram showing a prior art generic sequential cell 400. The generic sequential cell 400 includes a primitive sequential element 402 and a combinational logic block 404. The combinational logic block 404 includes three constraint pins S, D0, and D1. To complete setup and hold characterization of the generic sequential cell 400, the following timing constraints need to be optimized using binary search method:

setup time when pin D0 is rising;
setup time when pin D0 is falling;
hold time when pin D0 is rising;
hold time when pin D0 is falling;
setup time when pin D1 is rising;
setup time when pin D1 is falling;
hold time when pin D1 is rising;
hold time when pin D1 is falling;
setup time when pin S is rising and D0=1, D1=0;
setup time when pin S is falling and D0=1, D1=0;
hold time when pin S is rising and D0=1, D1=0;
hold time when pin S is falling and D0=1, D1=0;
setup time when pin S is rising and D0=0, D1=1;
setup time when pin S is falling and D0=0, D1=1;
hold time when pin S is rising and D0=0, D1=1;
hold time when pin S is falling and D0=0, D1=1;

Thus, the number of optimization runs increases from four to sixteen when the combinational logic block 404 is added to the primitive sequential element 402. Moreover, the number of optimization runs increases further when more complex combinational logic is used in a sequential cell, resulting in slower setup and hold characterization.

In view of the foregoing, there is a need for systems and methods that provide enhanced setup and hold characterization. The methods should be capable of providing fast setup and hold characterization, while being accurate in determining values for the setup and hold times of a standard cell.

SUMMARY OF THE INVENTION

Broadly speaking, the present invention fills these needs by providing a method for accurately characterizing the constraint pins of an integrated circuit cell. The method provides accuracy comparable to a binary search pin characterization method, while increasing the speed with which the characterization can be performed. In one embodiment, a method for setup and hold characterization in an integrated circuit cell is disclosed. The method includes obtaining a setup time for a first constraint pin. A setup time is then calculated for a test point defined in the integrated circuit cell using the setup time for the first constraint pin and a first propagation delay from the first constraint pin to the test point. Next, a setup time for a second constraint pin is determined based on the setup time for the test point and a second propagation delay from the second constraint pin to the test point. Generally, the test point is a constraint input of a primitive sequential element within the integrated circuit cell, and is used to determine a setup time for each of a plurality of constraint pins based on the setup time for the test point and a propagation delay from each of the plurality of constraint pins to the test point. In addition to the setup time, a hold time can be obtained for the first constraint pin. Then, a hold time for the test point can be calculated using the hold time for the first constraint pin and the first propagation delay. Further, a hold time for the second constraint pin can be determined based on the hold time for the test point and the second propagation delay. The same method can be used to determine a hold time for each of a plurality of constraint pins based on the hold time for the test point and a propagation delay from each of the plurality of constraint pins to the test point.

In another embodiment, a further method for setup and hold characterization in an integrated circuit cell is disclosed. A test point is defined in an integrated circuit cell, and both a first propagation delay from a first constraint pin to the test point and a second propagation delay from a second constraint pin to the test point are determined. Then, a setup time for the test point is calculated by subtracting the first propagation delay from a setup time for the first constraint pin. Then, a setup time for the second constraint pin is calculated by adding the second propagation delay to the setup time for the test point. In addition, a hold time can be obtained for the first constraint pin, and a hold time for the test point can be determined by adding the first propagation delay to the hold time for the first constraint pin. Further, a hold time for the second constraint pin can be calculated by subtracting the second propagation delay from the hold time for the test point. As mentioned above, the method can be used to determine the setup and hold times for a plurality of constraint pins.

In a further embodiment, an integrated circuit cell having a plurality of input constraint pins, a reference pin, and an output pin is disclosed. The input constraint pins have setup and hold times characterized by obtaining a setup time for a first constraint pin, and calculating a setup time for a test point defined in the integrated circuit cell using the setup time for the first constraint pin and a first propagation delay from the first constraint pin to the test point. In addition, a setup time for a second constraint pin is determined based on the setup time for the test point and a second propagation delay from the second constraint pin to the test point. Also, a hold time for the first constraint pin can be obtained, and a hold time for the test point can be calculated using the hold time for the first constraint pin and the first propagation delay. Further, a hold time for the second constraint pin can be determined based on the hold time for the test point and the second propagation delay.

Advantageously, the embodiments of the present invention reduce the number of binary search runs to that required by a single primitive element, while providing accurate cell characterization values for use in integrated circuit fabrication. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for enhanced setup and hold characterization in an integrated circuit. The present invention provides a method for accurately characterizing setup and hold timing constraints for the constraint pins of an integrated circuit cell. The method provides accuracy comparable to a binary search pin characterization method, while increasing the speed with which the characterization can be performed. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
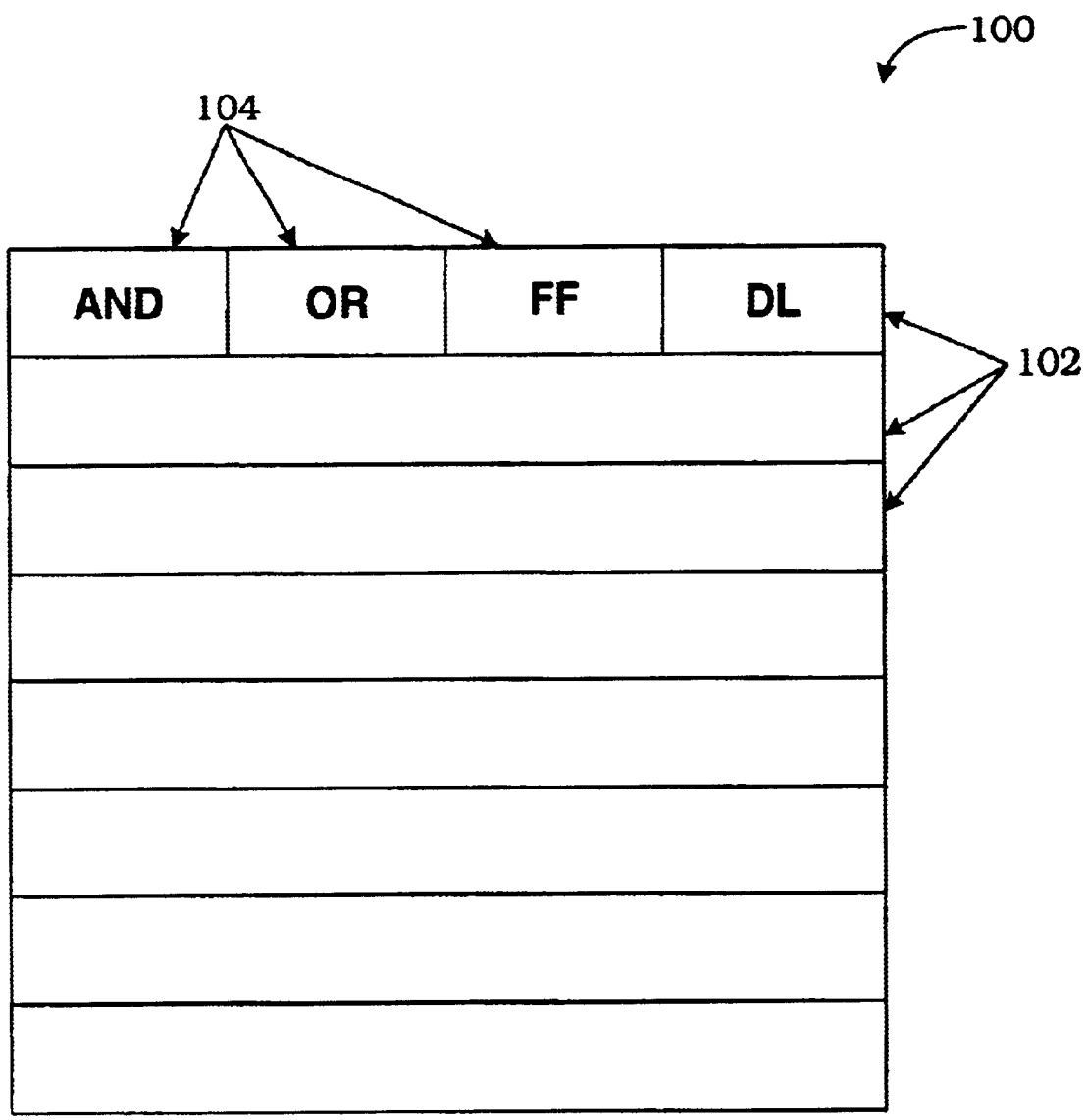
FIG. 1 is a schematic diagram of a section of an exemplary prior art integrated circuit.
Figure 2:
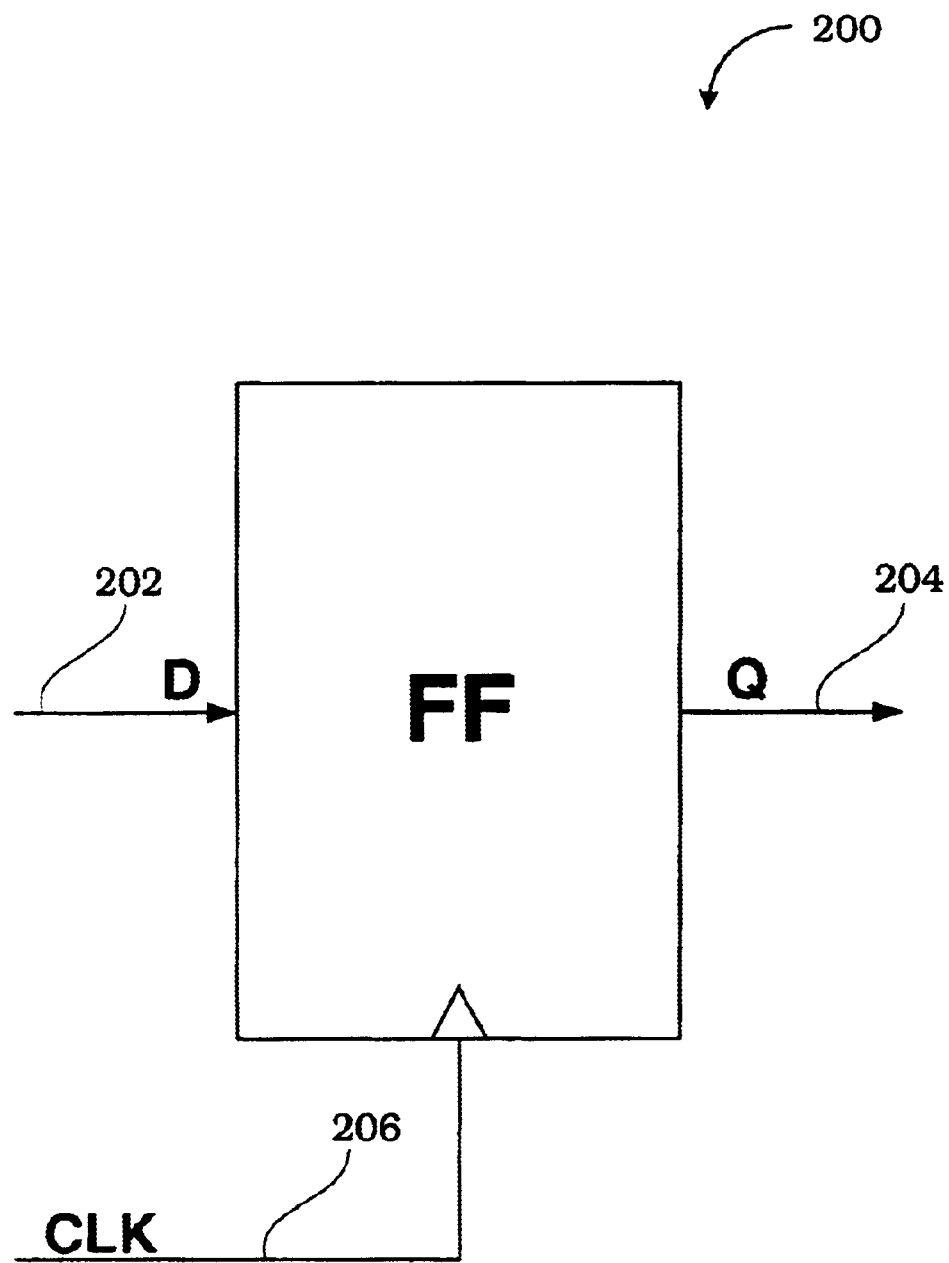
FIG. 2 is a schematic diagram showing a prior art flip-flop.
Figure 3:
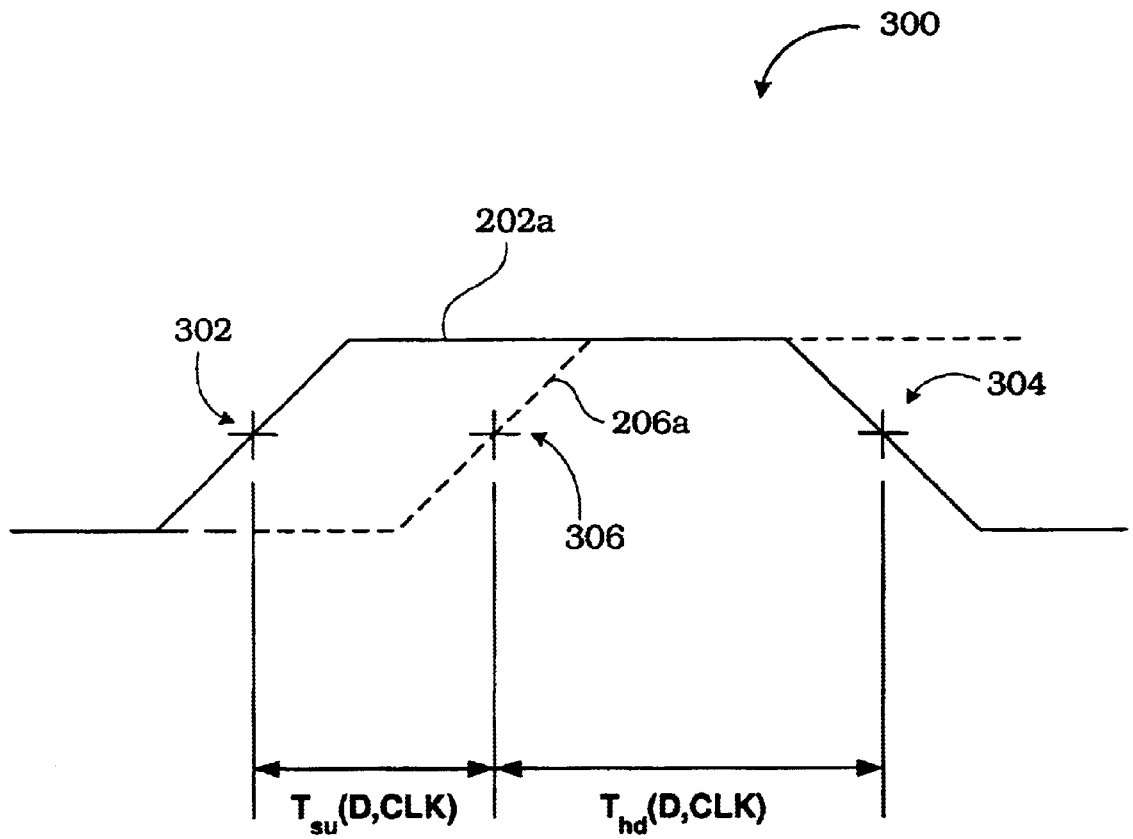
FIG. 3 is a timing diagram illustrating setup and hold times for the flip-flop.
Figure 4:
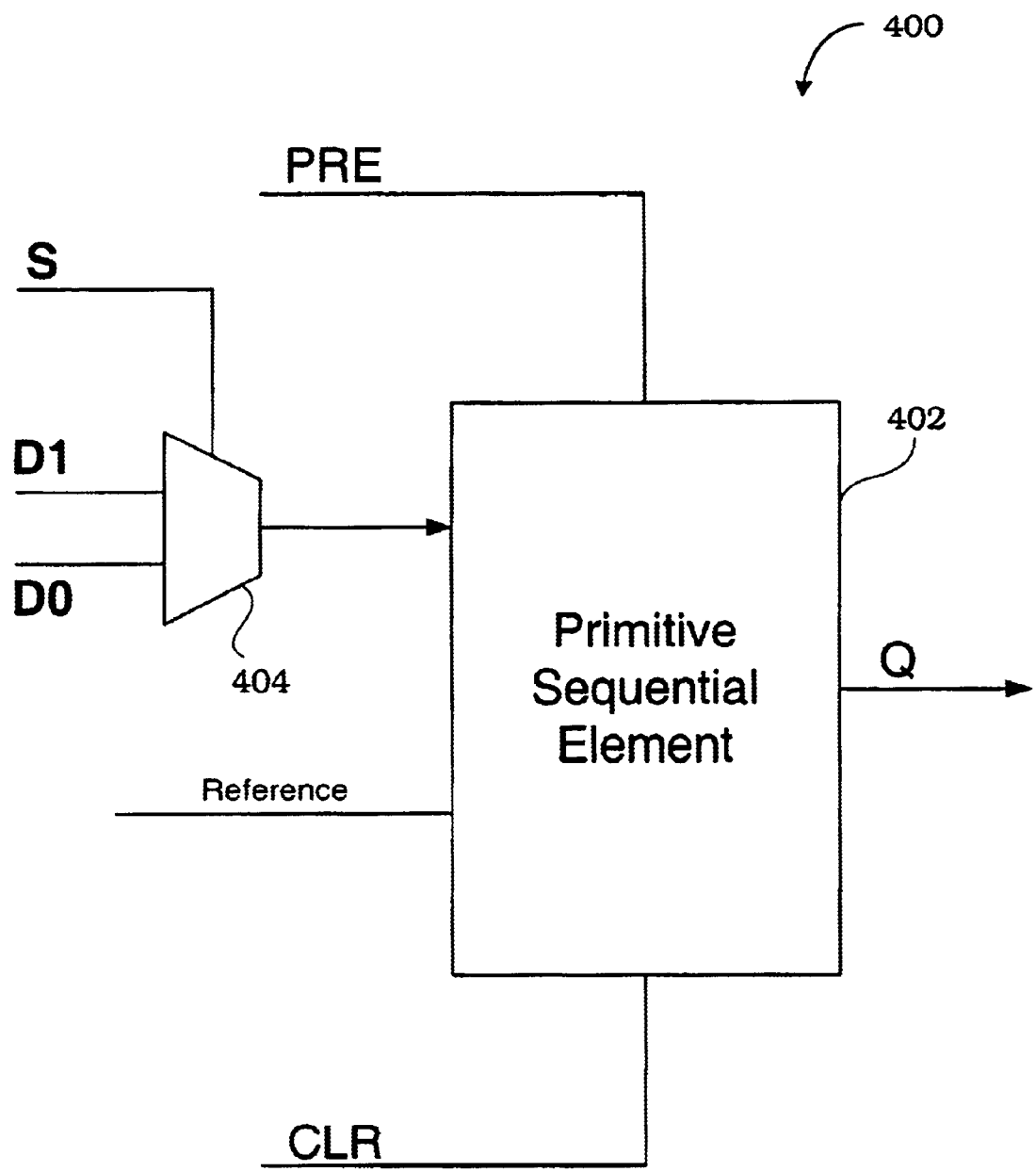
FIG. 4 is a schematic diagram showing a prior art generic sequential cell.
Figure 5:
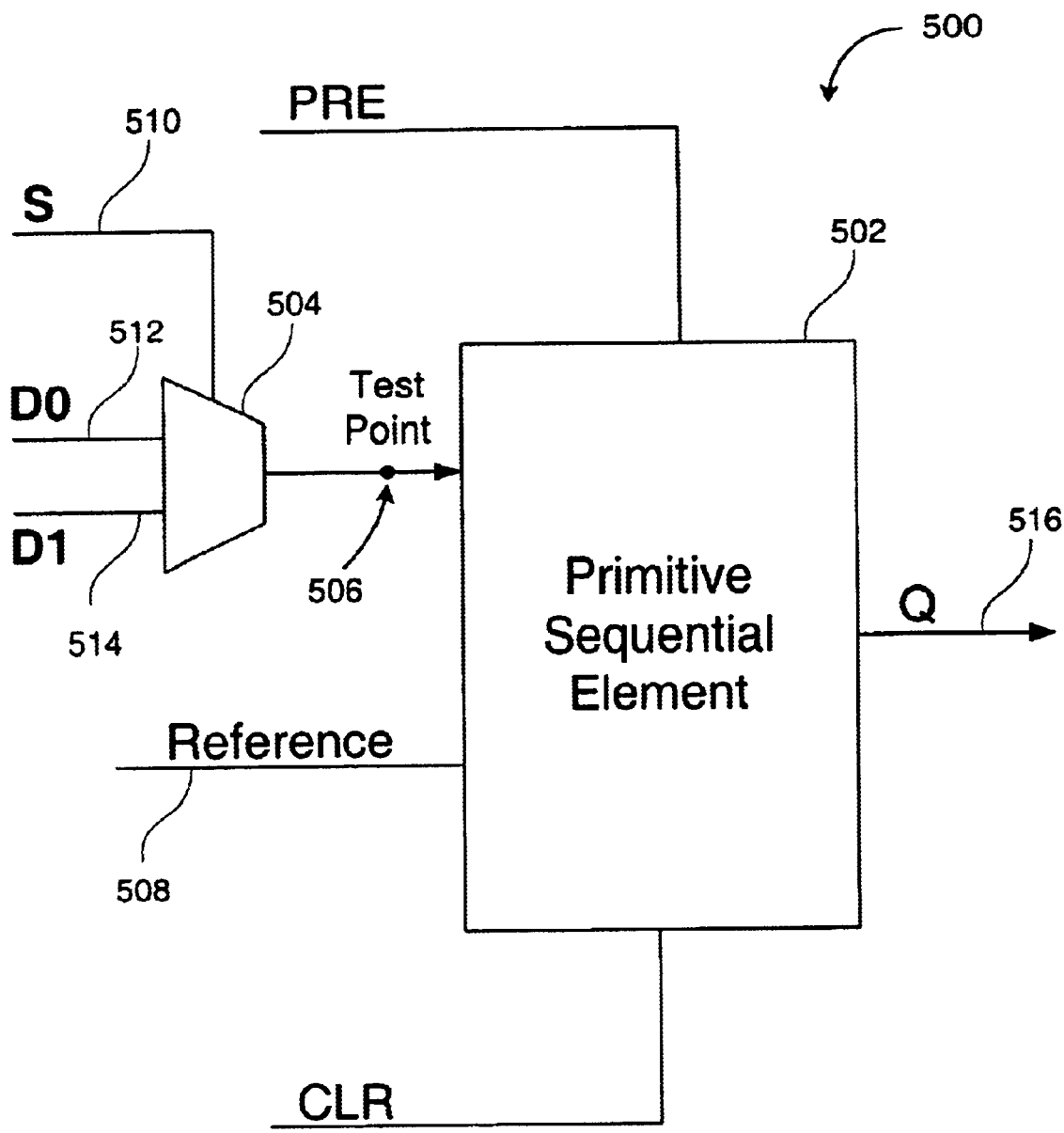
FIG. 5 is a schematic diagram showing a generic sequential cell, in accordance with an embodiment of the present invention.

FIGS. 1–4 were described in terms of the prior art. FIG. 5 is a schematic diagram showing a generic sequential cell 500, in accordance with an embodiment of the present invention. The generic sequential cell 500 includes a primitive sequential element 502 and a combinational logic block 504 having constraint pins S 510, D0 512, and D1 514. Also included in the generic sequential cell 500 is a reference pin 508, an output pin Q 516, and a test point 506. The primitive sequential element 502 can be any sequential elements such as a flip-flop or latch. Further, the reference pin is generally a clock, for a flip-flop, or an enable, for a latch.

The embodiments of the present invention allow fast characterization of sequential cells by determining the setup and hold times for one constraint pin and then using those results to calculate the setup and hold times for the remaining constraint pins. More specifically, a test point 506 is defined within the sequential cell 500. In the generic sequential cell 500, all the constraint pins S 510, D0 512, and D1 514 are connected to the constraint input of the primitive sequential element 502 at the test point 506. This test point 506 is preferably used to characterize the remaining constraint pins of the sequential cell 500, as described in greater detail subsequently.

As mentioned above, the embodiments of the present invention determine the setup and hold time at first constraint pin, for example constraint pin D0 512. To determine the setup and hold time for constraint pin D0 512, the embodiments of the present invention can use either the test point method or the binary search method, as described previously. Although the test point method provides fast results, the greater accuracy provided by the binary search method is preferred. Thus, embodiments of the present invention can use the binary search method to determine the setup rising time, setup falling time, hold rising time, and hold falling time for constraint pin D0 512.

Further, the constraint pins of sequential cell 500 is characterized for a plurality of input ramps. Specifically, an input ramp is determined for each constraint pin S 510, D0 512, and D1 514. In addition, a propagation delay is determined from each constraint pin S 510, D0 512, and D1 514 to the test point 506. Also, the ramp time at the test point is determined. These ramp times and propagation delays can be determined using a plurality of methods, as will be apparent to those skilled in the art.

Figure 6:
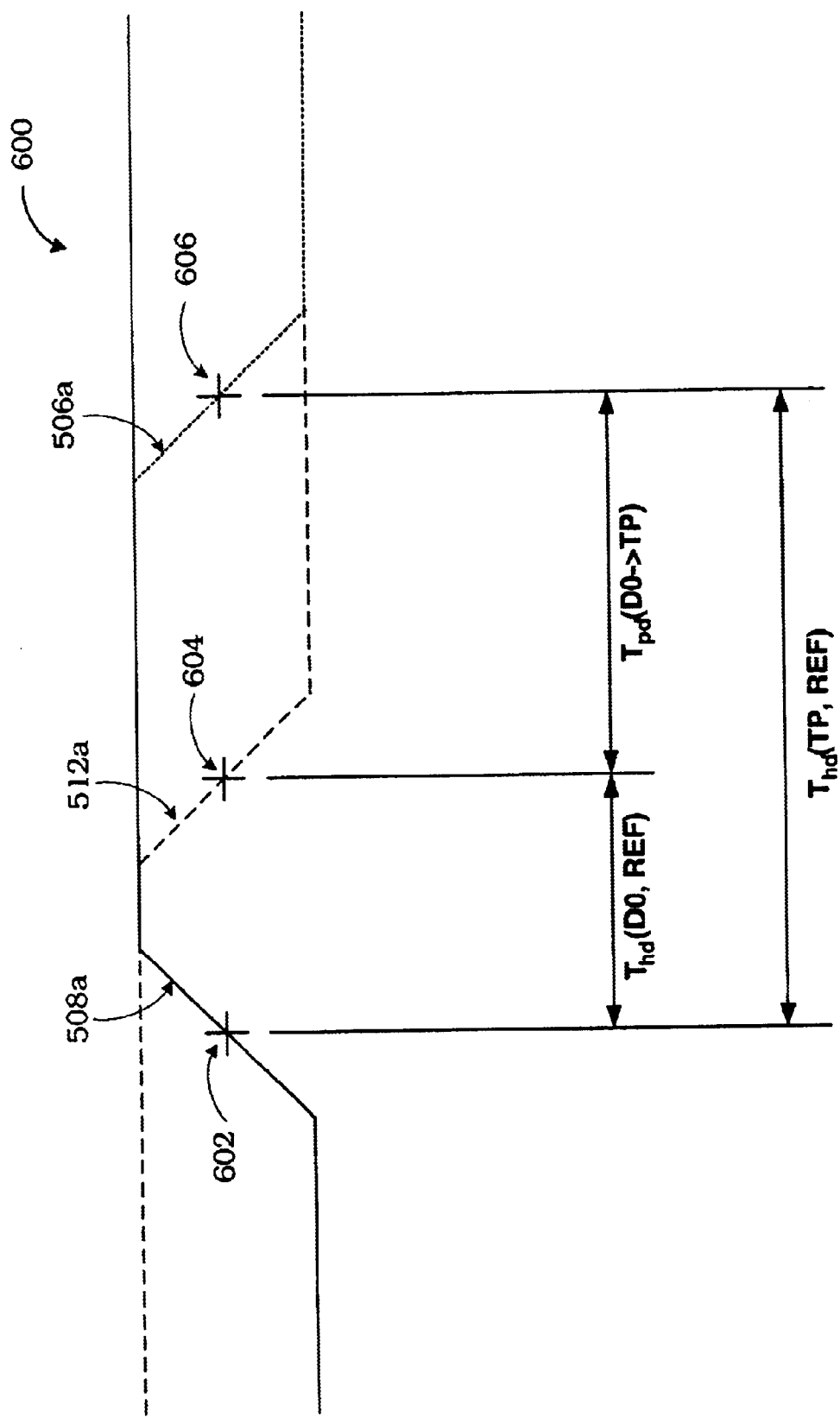
FIG. 6 is a timing diagram showing hold time signals for constraint pin D0 and the test point of the generic sequential cell, in accordance with an embodiment of the present invention.

Since the ramp and propagation delay times are known for constraint pin D0 512, these values can be used to determine the setup and hold times for the test point 506. FIG. 6 is a timing diagram showing hold time signals 600 for constraint pin D0 512 and the test point 506 of the generic sequential cell 500, in accordance with an embodiment of the present invention. The hold time signals 600 include a reference signal 508a, a constraint pin D0 signal 512a, and a test point signal 506a. Point 602 is the time when the reference signal 508, such as the clock, is considered asserted. Point 604 is the time when the data on pin D0 512 is no longer considered available, and point 606 is the time when the data from the combinational logic block 504 is no longer available at the test point 506.

FIG. 6 illustrates a method for determining the hold time for the test point 506. In particular, the time period between point 602 and point 604 is the hold time for constraint pin D0 512 and the reference pin 508. The time period between point 604 and point 606 is the propagation delay between the constraint pin D0 512 and the test point 506. To determine the hold time for the test point 506, the propagation delay between the constraint pin D0 512 and the test point 506 is added to the hold time for the constraint pin D0 508. Thus, the equation is:

$$T_{hd}(TP,REF)=T_{pd}(D0 \rightarrow TP)+T_{hd}(D0, REF), \quad (1)$$

where $T_{hd}$ (TP, REF) is the hold time for the test point 506 with respect to the reference pin 508, $T_{hd}(D0, REF)$ is the hold time for the constraint pin D0 512 with respect to the reference pin 508, and $T_{pd}$ (D0→TP) is the propagation delay between the constraint pin D0 512 and the test point 506.

Figure 7:
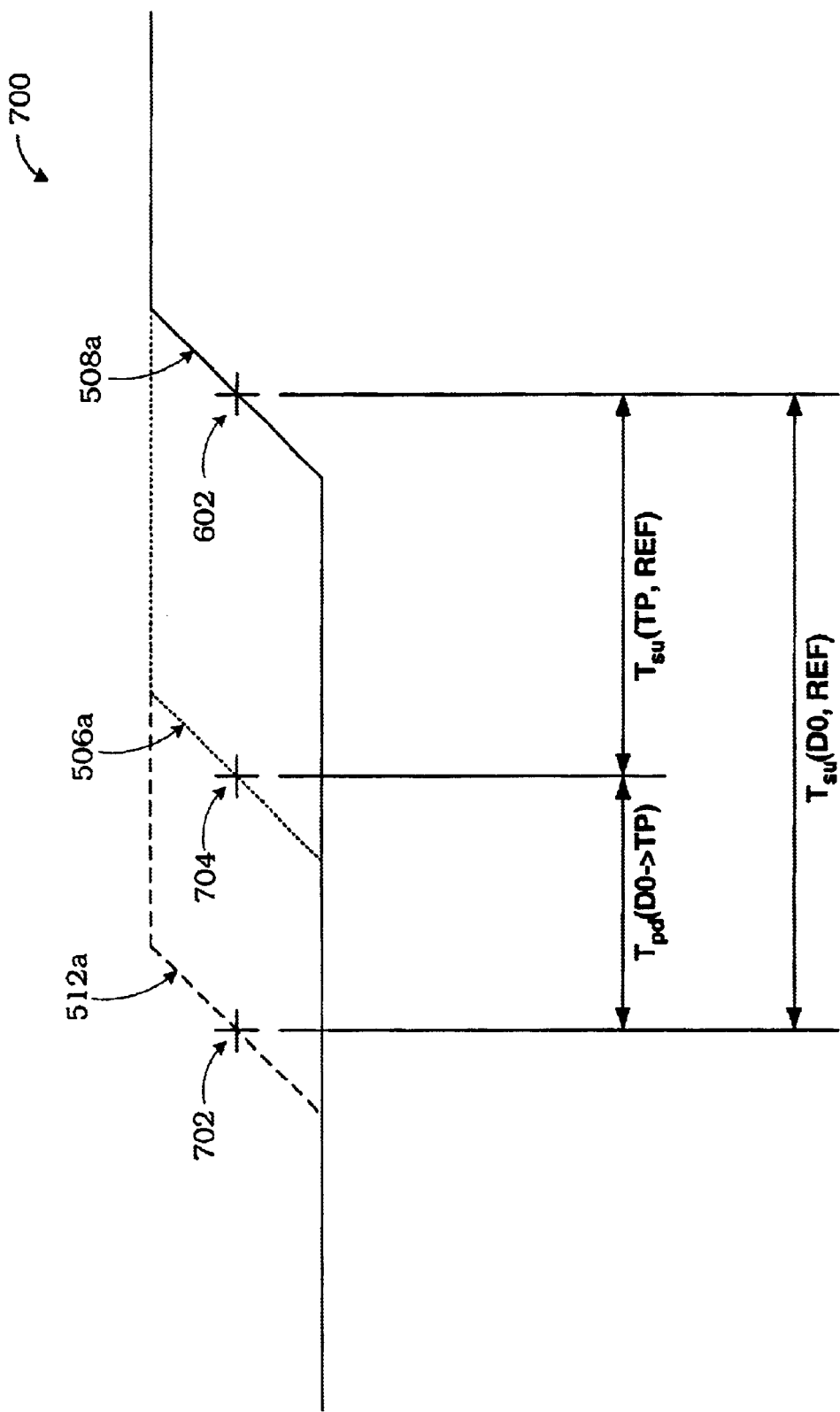
FIG. 7 is a timing diagram showing setup time signals for constraint pin D0 and the test point of the generic sequential cell, in accordance with an embodiment of the present invention.

FIG. 7 is a timing diagram showing setup time signals 700 for constraint pin D0 512 and the test point 506 of the generic sequential cell 500, in accordance with an embodiment of the present invention. The setup time signals 700 include the reference signal 508a, the constraint pin D0 signal 512a, and the test point signal 506a. Point 602 is the time when the reference signal 508 is considered asserted. Point 702 is the time when the data on pin D0 512 is considered available, and point 704 is the time when the data from the combinational logic block 504 is available at the test point 506.

FIG. 7 illustrates a method for determining the setup time for the test point 506. More particularly, the time period between point 702 and point 602 is the setup time for constraint pin D0 512 and the reference pin 508. The time period between point 702 and point 704 is the propagation delay between the constraint pin D0 512 and the test point 506. To determine the setup time for the test point 506, the propagation delay between the constraint pin D0 512 and the test point 506 is subtracted from the setup time for the constraint pin D0 508. Thus, the equation is:

$$T_{su}(TP, REF)=T_{su}(D0, REF)-T_{pd}(D0 \rightarrow TP) \quad (2)$$

where $T_{su}$ (TP,REF) is the setup time for the test point 506 with respect to the reference pin 508, $T_{su}(D0,REF)$ is the setup time for the constraint pin D0 512 with respect to the reference pin 508, and $T_{pd}(D0 \rightarrow TP)$ is the propagation delay between the constraint pin D0 512 and the test point 506.

Based upon the timing constraint values at the test point 506 and the ramp and propagation delay data obtained earlier for the remaining constraint pins of the sequential cell, the timing constraint values for the remaining constraint pins of the sequential cell can be determined. Specifically, to determine the setup time for a constraint pin, the propagation delay between the constraint pin and the test point 506 is added to the setup time for the test point 506 determined previously. Similarly, to determine the hold time for a constraint pin, the propagation delay between the constraint pin and the test point 506 is subtracted from the hold time for the test point 506. Thus, the equation for determining the setup time for remaining constraint pin S 510 of the generic sequential cell 500 of FIG. 5 is as follows:

$$T_{su}(S,REF)=T_{su}(TP,REF)+T_{pd}(S \rightarrow TP), \quad (3)$$

where $T_{su}(S,REF)$ is the setup time for the constraint pin S 510 with respect to reference pin 508, $T_{su}(TP,REF)$ is the setup time for the test point 506 with respect to the reference pin 508, and $T_{pd}(S \rightarrow TP)$ is the propagation delay between the constraint pin S 510 and the test point 506.

Similarly, the equation for determining the hold time for remaining constraint pin S 510 of the generic sequential cell 500 is:

$$T_{hd}(S,REF) = T_{hd}(TP,REF) - T_{pd}(S \rightarrow TP), \quad (4)$$

where $T_{hd}$ (S,REF) is the hold time for the constraint pin S 510 with respect to the reference pin 508, and $T_{hd}$ (TP,REF) is the hold time for the test point 506 with respect to the reference pin 508. The remaining constraint pin D1 is similarly determined as follows:

$$T_{su}(D1,REF) = T_{su}(TP,REF) + T_{pd}(D1 \rightarrow TP), \quad (5)$$

$$T_{hd}(D1,REF) = T_{hd}(TP,REF) - T_{pd}(D1 \rightarrow TP), \quad (6)$$

where $T_{su}$(D1,REF) is the setup time for the constraint pin D1 514 with respect to the reference pin 508, $T_{pd}$ (D1→TP) is the propagation delay between the constraint pin D1 514 and the test point 506, and where $T_{hd}$ (D1,REF) is the hold time for the constraint pin D1 514 with respect to the reference pin 508.

All the above described calculations use the information related to the logical relationship between the constraint pins, namely, D0 512, D1 514, and S 510 and the test point 506 known as the arc unateness as well as the ramp times observed at these two points because the propagation delay has a dependency upon the ramp times. In addition, interpolation of the data can be used to increase the accuracy of the results, as will be apparent to those skilled in the art.

Figure 8:
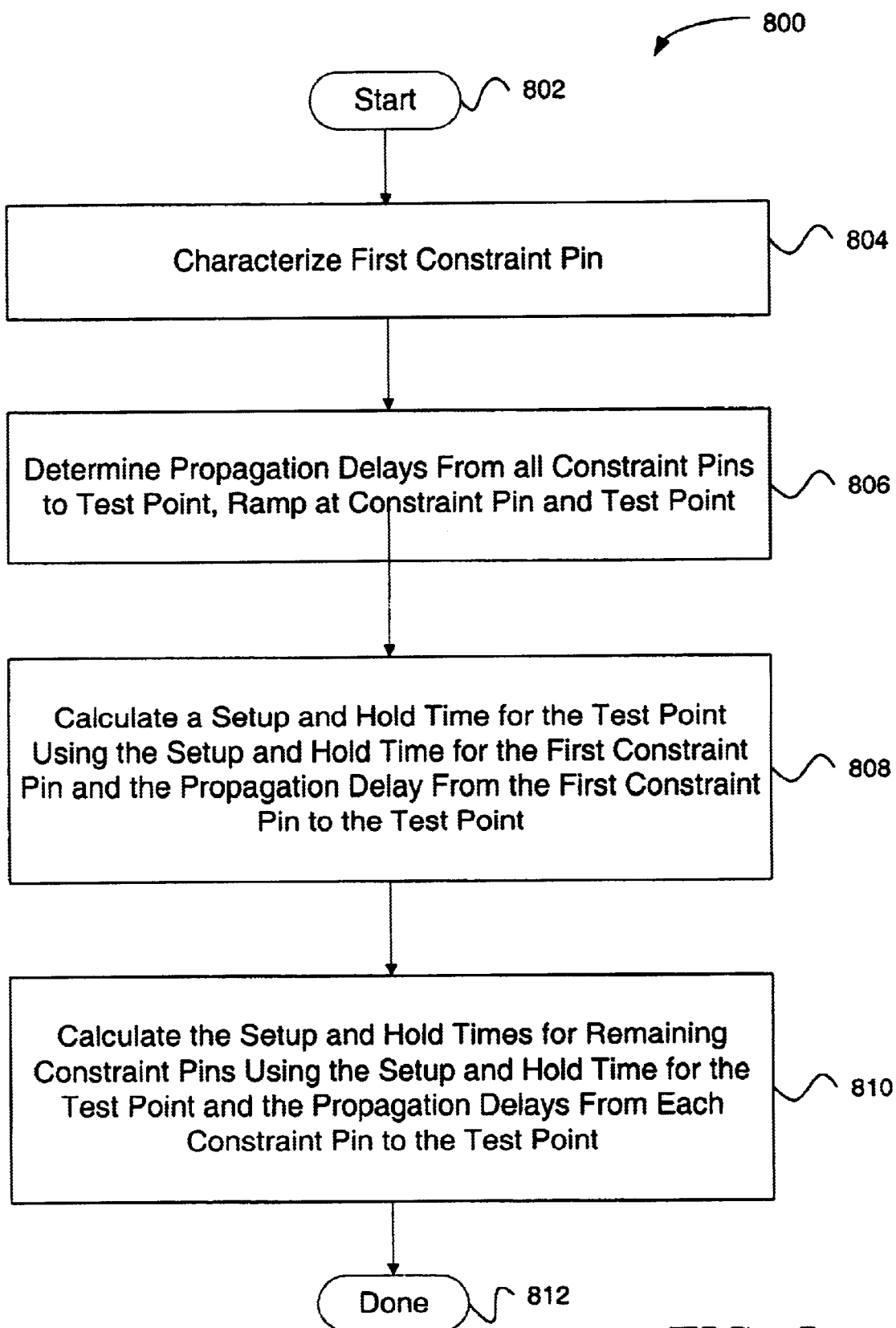
FIG. 8 is a flowchart showing a method for setup and hold characterization in an integrated circuit cell, in accordance with an embodiment of the present invention.

FIG. 8 is a flowchart showing a method 800 for setup and hold characterization in an integrated circuit cell, in accordance with an embodiment of the present invention. In an initial operation 802, preprocess operations are performed. Preprocess operations include cell design, cell layout, and other preprocess operations that will be apparent to those skilled in the art.

In a first characterization operation 804, a first constraint pin is characterized. As mentioned previously, the embodiments of the present invention determine the setup and hold time the first constraint pin using either the test point method or the binary search method. Although the test point method provides fast results, the greater accuracy provided by the binary search method is preferred. Thus, embodiments of the present invention can use the binary search method to determine the setup rising time, setup falling time, hold rising time, and hold falling time for constraint pin.

Generally, the binary search method uses a SPICE simulation to extract the values of setup and hold times for the first constraint pin and the reference pin. Typically, a suitable test structure is fabricated, which is designed to have a measurable electrical property, which depends upon the value of the interconnect process parameter of interest. Starting from an estimated value for the setup and hold times, and keeping the values of any other interconnect process parameters constant, the SPICE simulation reiterates until a converged value of the setup and/or hold time is obtained.

For example, given an actually measured capacitance, resistance, or inductance of a test structure, the setup time for the first constraint pin can be obtained by successive approximation. In particular, successively refined approximations of the setup time are fed into a SPICE simulation until the SPICE simulation predicts, within predetermined tolerance limits, the measured setup time. The current approximation of the setup time when the predicted value converges to the measured value is the desired value for the setup time.

In operation 806, propagation delays are determined from the constraint pins to the test point. The sequential cell is characterized for a plurality of input ramps and propagation delays in operation 806. Specifically, an input ramp is determined for each constraint pin, and a propagation delay is determined from each constraint pin to the test point. Also, the ramp time at the test point is determined. As previously mentioned, these ramp times and propagation delays can be determined using a plurality of methods, as will be apparent to those skilled in the art.

In operation 808, setup and hold times for the test point are calculated using the setup and hold time for the first constraint pin and the propagation delay from the first constraint pin to the test point. Since the ramp and propagation delay times were determined for the first constraint pin in operation 806, these values can be used to determine the setup and hold times for the test point. To determine the hold time for the test point, the propagation delay between the first constraint pin and the test point is added to the hold time for the first constraint pin, as shown by Equation 1 above. Similarly, to determine the setup time for the test point, the propagation delay between the first constraint pin and the test point is subtracted from the setup time for the first constraint pin, as shown by Equation 2 above.

The setup and hold times for the remaining constraint pins are calculated in operation 810 using the setup and hold times for the test point and the propagation delays determined in operation 806. Based upon the timing constraint values at the test point and the ramp and propagation delay data obtained in operation 806 for the remaining constraint pins of the sequential cell, the timing constraint values for the remaining constraint pins of the sequential cell can be determined. Specifically, to determine the setup time for each constraint pin, the propagation delay between the constraint pin and the test point is added to the setup time for the test point, which is determined in operation 808. Similarly, to determine the hold time for a constraint pin, the propagation delay between the constraint pin and the test point is subtracted from the hold time for the test point, which is also determined in operation 808.

Post process operations are performed in operation 812. Post process operations include characterizing further sequential cells, fabrication of the integrated circuit, and other post process operations that will be apparent to those skilled in the art. Advantageously, the embodiments of the present invention reduce the number of binary search runs to that required by a single primitive element, while providing accurate cell characterization values for use in integrated circuit fabrication.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for setup and hold characterization in an integrated circuit cell, comprising the operations of:

obtaining a setup time for a first constraint pin;

calculating a setup time for a test point defined in the integrated circuit cell using the setup time for the first constraint pin and a first propagation delay from the first constraint pin to the test point; and determining a setup time for a second constraint pin based on the setup time for the test point and a second propagation delay from the second constraint pin to the test point.

2. A method as recited in claim 1, wherein the test point is a constraint input of a primitive sequential element.

3. A method as recited in claim 1, wherein a setup time is determined for each of a plurality of constraint pins based on the setup time for the test point and a propagation delay from each of the plurality of constraint pins to the test point.

4. A method as recited in claim 1, further comprising the operation of obtaining a hold time for the first constraint pin.

5. A method as recited in claim 4, further comprising the operation of calculating a hold time for the test point using the hold time for the first constraint pin and the first propagation delay.

6. A method as recited in claim 5, further comprising the operation of determining a hold time for the second constraint pin based on the hold time for the test point and the second propagation delay.

7. A method as recited in claim 6, wherein a hold time is determined for each of a plurality of constraint pins based on the hold time for the test point and a propagation delay from each of the plurality of constraint pins to the test point.

8. A method for setup and hold characterization in an integrated circuit cell, comprising the operations of:

defining a test point in an integrated circuit cell;

determining both a first propagation delay from a first constraint pin to the test point and a second propagation delay from a second constraint pin to the test point;

calculating a setup time for the test point by subtracting the first propagation delay from a setup time for the first constraint pin; and calculating a setup time for the second constraint pin by adding the second propagation delay to the setup time for the test point.

9. A method as recited in claim 8, wherein the test point is a constraint input of a primitive sequential element.

10. A method as recited in claim 8, wherein a setup time is determined for each of a plurality of constraint pins based on the setup time for the test point and a propagation delay from each of the plurality of constraint pins to the test point.

11. A method as recited in claim 8, further comprising the operation of obtaining a hold time for the first constraint pin.

12. A method as recited in claim 11, further comprising the operation of calculating a hold time for the test point by adding the first propagation delay to the hold time for the first constraint pin.

13. A method as recited in claim 12, further comprising the operation of calculating a hold time for the second constraint pin by subtracting the second propagation delay from the hold time for the test point.

14. A method as recited in claim 13, further comprising the operation of determining a propagation delay from each of a plurality of constraint pins to the test point.

15. A method as recited in claim 14, wherein a hold time is determined for each of the plurality of constraint pins by subtracting the propagation delay of each of the plurality of constraint pins from the hold time for the test point.

\* \* \* \* \*